US009481787B2

(12) United States Patent
Kamiya

(10) Patent No.: US 9,481,787 B2
(45) Date of Patent: Nov. 1, 2016

(54) METHOD FOR PRODUCING LATENT CURING AGENT

(75) Inventor: Kazunobu Kamiya, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 1161 days.

(21) Appl. No.: 13/389,356

(22) PCT Filed: Jul. 13, 2011

(86) PCT No.: PCT/JP2011/065963
§ 371 (c)(1),
(2), (4) Date: Feb. 7, 2012

(87) PCT Pub. No.: WO2012/035865
PCT Pub. Date: Mar. 22, 2012

(65) Prior Publication Data
US 2012/0153230 A1 Jun. 21, 2012

(30) Foreign Application Priority Data
Sep. 17, 2010 (JP) ................................. 2010-209707

(51) Int. Cl.
*H01B 1/20* (2006.01)
*C08G 59/00* (2006.01)
(Continued)

(52) U.S. Cl.
CPC ........... *C08L 63/00* (2013.01); *C08G 18/0852* (2013.01); *C08G 18/0866* (2013.01); *C08G 18/6446* (2013.01); *C08G 18/8029* (2013.01);
(Continued)

(58) Field of Classification Search
CPC .......... C08G 59/40; C08G 18/32; C08J 5/18; H01B 1/20; H01B 5/16; H01L 31/042
See application file for complete search history.

(56) References Cited

U.S. PATENT DOCUMENTS 3,497,524 A * 2/1970 Payne ................ C08G 59/5093
525/488
4,900,801 A * 2/1990 Takata ................ C07D 303/24
528/87
(Continued)

FOREIGN PATENT DOCUMENTS

JP    A-09-115335     5/1997
JP    2006-291053 A   10/2006
(Continued)

OTHER PUBLICATIONS

Mar. 19, 2013 International Preliminary Report on Patentability issued in International Application No. PCT/JP2011/065963 (with translation).

(Continued)

*Primary Examiner* — Mark Kopec
(74) *Attorney, Agent, or Firm* — Oliff PLC

(57) ABSTRACT

A latent curing agent formed by holding an imidazole compound in porous resin particles is produced by emulsifying an oil phase obtained by dissolving a polyfunctional isocyanate compound in an organic solvent in an amount of 1.5 to 5 times by mass the amount of polyfunctional isocyanate compound in an aqueous phase obtained by dissolving a water-soluble polypeptide and a surfactant in water, then subjecting the emulsion to interfacial polymerization, adding a proteolytic enzyme to carry out an enzyme degradation treatment, then recovering the porous resin particles, and making an imidazole compound solution permeate into the recovered porous resin particles.

13 Claims, 5 Drawing Sheets

(51) Int. Cl.
    *C08L 63/00*     (2006.01)
    *C08G 59/40*     (2006.01)
    *C08G 59/18*     (2006.01)
    *C09J 163/00*     (2006.01)
    *C08G 18/64*     (2006.01)
    *C08G 18/80*     (2006.01)
    *C08G 18/08*     (2006.01)
    *H01L 31/048*     (2014.01)

(52) U.S. Cl.
    CPC ............. *C08G 59/188* (2013.01); *C08G 59/40* (2013.01); *C09J 163/00* (2013.01); *H01B 1/20* (2013.01); *H01L 31/0481* (2013.01); *Y02E 10/50* (2013.01)

(56) References Cited

U.S. PATENT DOCUMENTS

2007/0010636 A1* 1/2007 Kamiya et al. ............... 525/523
2010/0324170 A1* 12/2010 Kamiya ........................ 523/206

FOREIGN PATENT DOCUMENTS

| JP | A-2006-291053 | | 10/2006 | |
| JP | A-2009-051960 | | 3/2009 | |
| JP | A-2009-102610 | | 5/2009 | |
| JP | A-2010-168525 | | 8/2010 | |
| JP | 2011-001558 | * | 1/2011 | ............ C08G 59/50 |
| JP | A-2011-001558 | | 1/2011 | |
| WO | WO 2009/028224 A1 | | 3/2009 | |

OTHER PUBLICATIONS

Oct. 11, 2011 International Search Report issued in International Application No. PCT/JP2011/065963.

Japanese Office Action issued in Application No. 2010-209707; Dated Dec. 3, 2013 (With Translation).

Dec. 22, 2014 Office Action issued in Taiwanese Patent Application No. 100127671.

* cited by examiner

METHOD FOR PRODUCING LATENT CURING AGENT

TECHNICAL FIELD

The present invention relates to a method for producing a latent curing agent which can initiate the curing of a thermosetting resin composition having an epoxy resin and the like as a main component at a relatively low temperature.

BACKGROUND ART

As a latent curing agent for a thermosetting epoxy resin composition, a microcapsule-type latent curing agent has been proposed (Patent Literature 1) in which an imidazole compound is held in porous resin particles, which are the product of interfacial polymerization of a polyfunctional isocyanate compound. This latent curing agent is produced by preparing an oil-in-water emulsion formed by emulsifying an oil phase obtained by dissolving a polyfunctional isocyanate compound in ethyl acetate in an aqueous phase obtained by dissolving a surfactant and polyvinyl alcohol as a dispersant in water, and then forming porous resin particles by heating this emulsion to carry out interfacial polymerization of the polyfunctional isocyanate compound in the oil phase. These porous resin particles are recovered, dried, and then dipped in an imidazole compound solution formed by dissolving the imidazole compound in ethanol to make the imidazole compound solution permeate into the porous resin particles. The porous resin particles permeated with the imidazole compound solution are then recovered, washed, and dried to produce the latent curing agent.

CITATION LIST

Patent Literature

[Patent Literature 1] Japanese Patent Laid-Open Application No. 2006-291053

SUMMARY OF THE INVENTION

Problems to be Solved by the Invention

Although the latent curing agent proposed by Patent Literature 1 achieves most of its intended characteristics concerning latency and low-temperature rapid curing properties, in order to improve the design freedom of a thermosetting epoxy resin composition, it is necessary that the intended curing properties can be realized even when less latent curing agent is added. In other words, the latent curing agent needs to be able to be produced while increasing the amount of imidazole compound solution that permeates into the porous resin particles than is currently the case without sacrificing latency and low-temperature rapid curing properties.

It is an object of the present invention to resolve the above-described problems in the conventional technology, and to produce a latent curing agent that is capable of having an increased amount of imidazole solution that permeates into porous resin particles than is currently the case without sacrificing latency and low-temperature rapid curing properties.

Solution to Problem

The present inventor has researched various dispersants under the hypothesis that the amount of imidazole solution that permeates into porous resin particles is greatly affected by the dispersant that is added to the aqueous phase that is used when emulsifying an oil phase that contains a polyfunctional isocyanate compound and an aqueous phase. As a result of this research, the present inventor has found that the above-described objective can be achieved by using as a dispersant a water-soluble polypeptide such as gelatin having an amino group that reacts with isocyanate groups, and performing an enzyme treatment with a proteolytic enzyme after interfacial polymerization, thereby completing the present invention.

Specifically, the present invention provides a method for producing a latent curing agent in which an imidazole compound is held in porous resin particles obtained by interfacial polymerization of a polyfunctional isocyanate compound, the method including the following steps (A) to (E):

Step (A) a step of obtaining an oil-in-water emulsion by emulsifying an oil phase obtained by dissolving a polyfunctional isocyanate compound in an organic solvent in an aqueous phase obtained by dissolving a water-soluble polypeptide and a surfactant in water;

Step (B) a step of forming porous resin particles by interfacial polymerization of the polyfunctional isocyanate compound in the oil phase by heating the oil-in-water emulsion;

Step (C) a step of carrying out an enzyme degradation treatment on the porous resin particles by adding a proteolytic enzyme into an interfacial polymerization solution in which the porous resin particles are dispersed;

Step (D) a step of recovering the porous resin particles that have been subjected to the enzyme degradation treatment from the interfacial polymerization reaction solution; and Step (E) a step of acquiring a latent curing agent in which an imidazole compound is held in porous resin particles, by mixing the recovered porous resin particles with an imidazole compound solution obtained by dissolving an imidazole compound in an organic solvent to make the imidazole compound solution permeate into the porous resin particles.

Further, the present invention provides a thermosetting resin composition characterized by including the latent curing agent obtained by the above-described production method and a thermosetting resin, an anisotropic conductive adhesive film formed by dispersing conductive particles for anisotropic conductive connection in this thermosetting resin composition and then forming the resultant dispersion into a film, and an adhesive film for a solar battery obtained by forming the thermosetting resin composition into a film.

Advantageous Effects of the Invention

In the production method of the present invention for producing a latent curing agent in which an imidazole compound is held in porous resin particles, a water-soluble polypeptide such as gelatin is used as a dispersant in the aqueous phase during interfacial polymerization. This water-soluble polypeptide has an amino group or a carboxyl group that reacts with isocyanate groups. Therefore, a polypeptide moiety derived from the water-soluble polypeptide is introduced onto or near to the surface of the porous resin particles, which are an intermediate product in the production method of the present invention. In the production method of the present invention, after interfacial polymerization, the porous resin particles into which this polypeptide moiety has been introduced are subjected to a proteolytic enzyme treatment, so that the polypeptide moiety is degraded into amino acids and oligopeptides. Therefore, compared with conventional porous resin particles obtained by interfacial polymerization using a polyvinyl alcohol as a dispersant, the permeability of the imidazole solution into the porous resin particles is improved. Accordingly, when the latent curing agent obtained by the production method of the present invention is added to a thermosetting resin composition in an amount smaller than that of a conventional latent curing agent, it can realize curing properties equivalent to those of the conventional latent curing agent. Further, such a thermosetting resin composition exhibits favorable low-temperature raid curing properties.

DESCRIPTION OF THE EMBODIMENTS

Figure 1A:
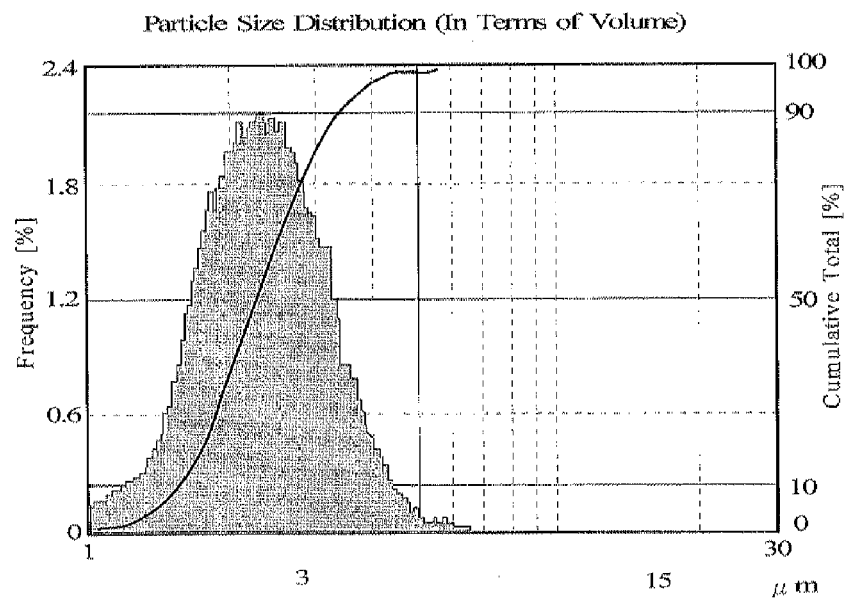
FIG. 1A is a particle size distribution diagram of the porous resin particles of Example 1.

The present invention is a method for producing a latent curing agent in which an imidazole compound is held in porous resin particles obtained by interfacial polymerization of a polyfunctional isocyanate compound. The method includes the following steps (A) to (E), which will now be described in more detail.

<Step (A)>

Step (A) is a step of obtaining an oil-in-water emulsion by emulsifying an oil phase obtained by dissolving a polyfunctional isocyanate compound in an organic solvent in an aqueous phase obtained by dissolving a water-soluble polypeptide and a surfactant in water.

In the step (A), first, the polyfunctional isocyanate compound is dissolved in an organic solvent to prepare a solution to serve as the oil phase in the interfacial polymerization. It is preferred that this organic solvent be a volatile organic solvent. The reason for this is as follows. If a high boiling point solvent having a boiling point of more than 300° C. such as that normally used in interfacial polymerization is used, the organic solvent does not evaporate during the interfacial polymerization. As a result, the chances of the isocyanate coming into contact with water do not increase, so that the level of progress of the interfacial polymerization between the water and isocyanate is not sufficient. This makes it difficult to obtain a polymer with good shape-retaining properties even by the interfacial polymerization. Moreover, even if such a polymer is obtained, the high-boiling-point solvent remaining in the polymer adversely affects the physical properties of the cured matter of the thermosetting resin composition when the polymer is blended in a thermosetting resin composition. For this reason, a volatile organic solvent is used as the organic solvent used in the preparation of the oil phase.

Preferably, this organic solvent is a good solvent for the polyfunctional isocyanate compound (solubility is preferably 0.1 g/ml (organic solvent) or higher), is essentially insoluble in water (solubility in water of 0.5 g/ml (organic solvent) or lower), and has a boiling point of 100° C. or below under atmospheric pressure. Specific examples of such an organic solvent include alcohols, acetic acid esters, and ketones. Of these solvents, it is preferred to use ethyl acetate because of its high polarity, low boiling point, and poor solubility in water.

If the used amount of the organic solvent is too low with respect to the polyfunctional isocyanate compound, latency deteriorates, while if the used amount is too high, thermal response deteriorates. Thus, the used amount is preferably 1.5 to 5 times by mass, and more preferably 1.5 to 3 times by mass, the used amount of the polyfunctional isocyanate compound. If a relatively large amount of organic solvent is used, hydrolysis of the isocyanate groups is suppressed during emulsification. As a result, the reaction between the amino groups in the water-soluble polypeptide in the aqueous phase and the isocyanate groups in the isocyanate compound in the oil phase competitively proceeds, so that the porous resin particles obtained after interfacial polymerization tend to have an irregular round shape. On the other hand, if a relatively small amount of organic solvent is used, the interfacial polymerization properties of the isocyanate compound are improved, so that the porous resin particles obtained after interfacial polymerization tend to have a spherical shape.

The viscosity of the solution to serve as the oil phase can be reduced by, for example, using a relatively large amount of organic solvent within the range of the organic solvent used amount. Lowering the viscosity improves the stirring efficiency, which enables the oil phase droplets in the reaction system to be formed more finely and uniformly. As a result, the particle size of the obtained latent curing agent can be controlled to a size in the order of submicrons to a few microns, thereby allowing a monodisperse particle size distribution. From this perspective, it is preferred to set the viscosity of the solution to serve as the oil phase to 1 to 500 mPa·s.

When dissolving the polyfunctional isocyanate compound in the organic solvent, this operation may be carried out by simply stirring and mixing under atmospheric pressure at room temperature, or optionally by heating.

Examples of the polyfunctional isocyanate compound used in the present invention include compounds which preferably have two or more, and more preferably three isocyanate groups, in one molecule. More preferred examples of such trifunctional isocyanate compounds include trimethylolpropane (TMP) adducts of formula (2) obtained by reacting 1 mol of TMP with 3 mols of a diisocyanate compound; isocyanurates of formula (3) obtained by self-condensation of 3 mols of a diisocyanate compound; and biurets of formula (4) obtained by condensation of diisocyanate urea obtained from 2 mols of 3 mols of a diisocyanate compound with the remaining 1 mol of the diisocyanate compound.

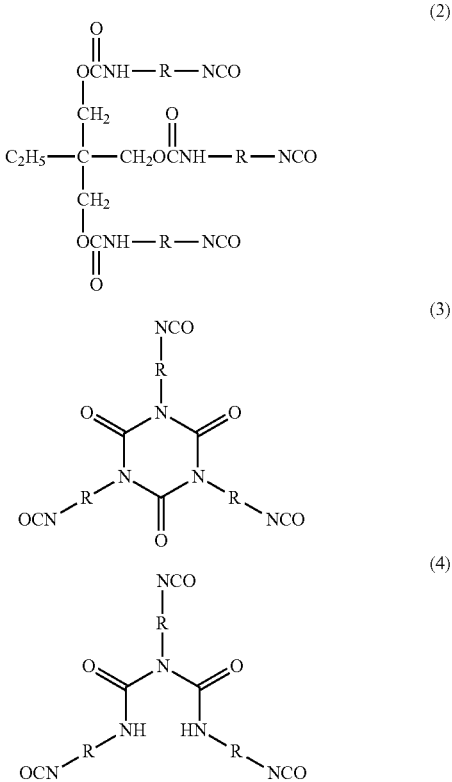

In the above (2) to (4), the substituent R is a moiety formed by removing an isocyanate group from a diisocyanate compound. Specific examples of the diisocyanate compound include toluene 2,4-diisocyanate, toluene 2,6-diisocyanate, m-xylylene diisocyanate, hexamethylene diisocyanate, hexahydro-m-xylylene diisocyanate, isophorone diisocyanate, and methylenediphenyl-4,4'-diisocyanate.

Next, the aqueous phase is prepared by dissolving a surfactant and a water-soluble polypeptide in water. The water-soluble polypeptide functions as a dispersant for dispersing the below-described porous resin particles in the aqueous phase.

The water-soluble polypeptide has a level of water solubility in which at least 1 g or more can be dissolved in 100 g of distilled water at 40° C. Examples of such a water-soluble polypeptide include collagen peptides, gelatin, and casein. Especially from the perspective of average molecular weight, gelatin is preferred. Further, from the perspective of enabling the particle size to be controlled to a single-digit micrometer, it is preferred to use gelatin which has undergone an acid treatment. Further, from the perspective of gel network formation, it is preferred to use a gelatin having a relatively low jelly strength. Specifically, it is preferred to use a gelatin which exhibits a jelly strength according to JIS K6503-2001 of 10 to 250. In addition, from the perspective of emulsion dispersion stability, it is preferred to use a gelatin having a weight average molecular weight of 1000 to 110000.

It is preferred to use distilled water or deionized water as the water. If the content of the water-soluble polypeptide, such as gelatin, with respect to water is too low, emulsification is destabilized, while if the content is too high, the emulsion dispersibility deteriorates. Thus, based on 100 parts by mass of water, the content of the water-soluble polypeptide is preferably 0.1 to 50 parts by mass, and more preferably 0.1 to 10 parts by mass. Further, if the content of the water-soluble polypeptide, such as gelatin, with respect to the polyfunctional isocyanate compound used is too low, the reactivity becomes low, while if the content is too high, the reactivity becomes high. Thus, based on 100 parts by mass of the polyfunctional isocyanate compound, the content of the water-soluble polypeptide is preferably 1 to 50 parts by mass, and more preferably 1 to 30 parts by mass.

For the purpose of emulsion stability, the aqueous phase contains a surfactant. From the perspectives of isocyanate reactivity and being free from a halogen, it is preferred to use an alkyl benzene sulfonate as the surfactant. Further, if the surfactant content is too low, the emulsion stability deteriorates, while if the surfactant content is too high, fine particles and bubbles are formed. Thus, based on 100 parts by mass of water, such as distilled water, the surfactant content is preferably 0.001 to 10 parts by mass, and more preferably 0.001 to 0.1 parts by mass.

In the step (A), the oil-in-water emulsion is formed by adding the above-described oil phase obtained by dissolving a polyfunctional isocyanate compound in an organic solvent to an aqueous phase containing a surfactant and gelatin, and emulsifying the resultant mixture. However, if the mixing ratio of the oil phase with respect to the aqueous phase is too low, a polydispersion is formed, while if the mixing ratio is too high, aggregates are formed as a result of the particles becoming finer. Thus, it is preferred to add 5 to 80 parts by mass of the oil phase based on 100 parts by mass of the aqueous phase.

Examples of the emulsification conditions include stirring carried out so that the volume average particle size of the oil phase is preferably 0.5 to 100 μm, and more preferably 0.5 to 30 μm, (e.g., a homogenizer serving as a stirring apparatus, stirring speed of 6,000 to 25,000 rpm; under atmosphere pressure, at room temperature, for stirring time of 1 to 30 minutes).

<Step (B)>

Step (B) is a step of forming porous resin particles by interfacial polymerization of the polyfunctional isocyanate compound in the oil phase by heating the oil-in-water emulsion prepared in the step (A).

The interfacial polymerization can be carried out following the step (A) by, for example, using a stirring device equipped with a known vaned stirring rod, heating and stirring at a stirring rate of 10 to 300 rpm for, usually, a stirring time of 2 to 12 hours at a temperature of 30 to 80° C. under atmospheric pressure. In addition, the steps (A) and (B) may be carried out simultaneously.

In such porous resin particles obtained by interfacial polymerization of a polyfunctional isocyanate compound, some of the isocyanate groups are hydrolyzed during the interfacial polymerization into amino groups. These amino groups react with the isocyanate groups to form a urea bond, and are thus polymerized to form a porous polyurea. Further, since the amino groups or carboxyl groups in the water-soluble polypeptide acting as a dispersant also react with the isocyanate groups, a polypeptide moiety derived from the water-soluble polypeptide by interfacial polymerization is introduced onto or near to the surface of the porous resin particles.

<Step (C)>

Step (C) is a step of carrying out an enzyme degradation treatment on the porous resin particles by adding a proteolytic enzyme all at once or little by little into the interfacial polymerization solution in which the porous resin particles prepared in the step (B) are dispersed. Due to the enzyme degradation treatment, the polypeptide moiety introduced onto or near to the surface of the porous resin particles is degraded, so that permeability of the imidazole compound solution into the interior of the porous resin particles is improved.

A known proteolytic enzyme can be used as the proteolytic enzyme, such as, for example, Protease N "Amano G", Newlase F3G, and Promeline F (Amano Enzyme Inc.). If the used amount of the proteolytic enzyme is too low, the peptide moiety is not sufficiently degraded, while if the used amount is too high, the proteolytic enzyme turns into residual foreign matter. Thus, it is preferred that the used amount of the proteolytic enzyme be 0.1 to 50 parts by mass, and more preferably 1 to 30 parts by mass, based on 100 parts by mass of the used water-soluble polypeptide, such as gelatin.

The enzyme treatment can be carried out by adjusting to an enzyme active temperature region (e.g., 30 to 60° C.) while stirring the interfacial polymerization reaction solution into which the proteolytic enzyme was added. Although the stirring time depends on factors such as temperature and the required degree of degradation, usually the stirring time is 1 to 12 hours.

<Step (D)>

Step (D) is a step of recovering the porous resin particles that have been subjected to the enzyme degradation treatment in the step (C) from the interfacial polymerization reaction solution. It is preferred to further carry out a drying treatment on the recovered porous resin particles. The recovery method is not especially limited, and may be carried out by a known technique. Further, after recovery, the porous resin particles may be washed with water or an organic solvent such as a hydrocarbon solvent. The drying treatment can be carried out by a known drying method, such as natural drying or vacuum drying. The porous resin particles that have been recovered or dried may then be subjected to a cracking treatment using a jet mill and the like to form primary particles.

<Step (E)>

Step (F) is a step of acquiring a latent curing agent in which an imidazole compound is held in porous resin particles, by mixing the porous resin particles obtained in the step (D) with an imidazole compound solution obtained by dissolving an imidazole compound in an organic solvent, making the imidazole compound solution permeate into the porous resin particles, and optionally recovering, washing, and drying the resultant porous resin particles.

A known imidazole compound that is used as a curing agent for an epoxy resin or the like can be used as the imidazole compound. Examples thereof include 2-methylimidazole (melting point of 137 to 145° C.), 2-undecylimidazole (melting point of 69 to 74° C.), 2-heptadecylimidazole (melting point of 86 to 91° C.), 1,2-dimethylimidazole (melting point of about 36° C.), 2-ethyl-4-methylimidazole (melting point of about 41° C.), 2-phenylimidazole (melting point of 137 to 147° C.), 2-phenyl-4-methylimidazole (melting point of 174 to 184° C.), 1-benzyl-2-methylimidazole (melting point of about 50° C.) and 1-benzyl-2-phenylimidazole (melting point of about 40° C.). These imidazole compounds may be used alone, or two kinds or more be used in combination. Among these imidazole compounds, it is preferred to use 2-methyl imidazole, which has good curing activity.

When the imidazole compound includes two kinds of imidazole compound, it is preferred that the imidazole compound include 2-methylimidazole (melting point of 137 to 145° C.) and a separate imidazole compound having a melting point equal to or lower than the melting point of 2-methylimidazole. Specifically, it is preferred that the imidazole compound include 2-methylimidazole having a melting point of 137 to 145° C. and 2-ethyl-4-methylimidazole having a melting point of about 41° C. or 2-phenylimidazole having a melting point of 137 to 147° C. In such a case, it is preferred that the imidazole compound include 50 mass % or more of 2-methylimidazole.

It is preferred that the organic solvent for dissolving the above imidazole compound be a good solvent for the imidazole compound (solubility of preferably 0.1 g/ml (organic solvent) or higher), and have a boiling point of 100° C. or below under atmospheric pressure. Specific examples of such an organic solvent include alcohols, acetic acid esters, and ketones. Of these, ethanol is preferred because of its high polarity and low boiling point.

If the used amount of the organic solvent with respect to the imidazole compound is too low, the permeability of the imidazole solution into the porous resin particles deteriorates, while if the used amount is too high, the absolute amount of the imidazole compound that permeates into the interior of the porous resin particles decreases. Thus, the used amount of the organic solvent is preferably 1 to 5 times by mass, and more preferably 1 to 3 times by mass, the amount of the imidazole compound.

To improve the curing properties of the imidazole compound, it is preferred to further include in the imidazole compound solution a tertiary amine compound to serve as a curing accelerator for an epoxy compound. Examples of this tertiary amine compound include dimethylethanolamine, dimethylbenzylamine, 2,4,6-tris(dimethylaminomethyl)phenol, and 1,8-diazabicyclo[5.4.0]undecene. Among these, from the perspective of a curing acceleration effect, it is preferred to use 2,4,6-tris(dimethylaminomethyl)phenol.

If the used amount of the tertiary amine compound with respect to the imidazole compound is too low, the rapid curing properties deteriorate, while if the used amount is too high, the low-temperature curing properties deteriorate. Thus, the used amount of the tertiary amine compound is preferably 0.1 to 1.0 times by mass, and more preferably 0.1 to 0.8 times by mass, the amount of the imidazole compound.

The above-described imidazole compound solution and the porous resin particles acquired in the step (D) that have been subjected to the enzyme degradation treatment are mixed, which causes the imidazole compound solution to permeate into the porous resin particles. Usually, this permeation operation is carried out by stirring for 24 hours under heating or at room temperature. After the permeation treatment, a latent curing agent in which the imidazole compound is held in the porous resin particles can be acquired by recovering the porous resin particles by an ordinary method from the imidazole compound solution, and preferably then washing the recovered porous resin particles with water and vacuum-drying them. The latent curing agent can optionally be subjected to a cracking treatment with a jet mill, for example.

To improve the thermal stability and the latency of the thus-obtained latent curing agent, it is preferred that the imidazole compound that is at or near the surface of the latent curing agent be removed by sublimation caused by a heat treatment. In this case, to prevent the latent curing agent from agglomerating, it is preferred to carry out the heat treatment at a temperature that does not exceed the melting point of the imidazole compound. For example, if 2-methylimidazole (melting point of 137 to 145° C.) is used as the imidazole compound, the heat treatment temperature is 80 to 120° C. The heat treatment time is usually 0.25 to 1 hour.

The above-described production method of the present invention allows the curing properties of the latent curing agent to be controlled by changing the type and used amount of the polyfunctional isocyanate compound, the type and used amount of the water-soluble polypeptide, the interfacial polymerization conditions, and the proteolytic enzyme treatment conditions. For example, by lowering the polymerization temperature, the curing temperature can be decreased. Conversely, by increasing the polymerization temperature, the curing temperature can be increased.

The thus-obtained latent curing agent can be used for the same applications as conventional imidazole-based latent curing agents. By combining with a thermosetting resin, the latent curing agent can provide a low-temperature rapid curing thermosetting resin composition.

If the content of the latent curing agent of the present invention in the thermosetting resin composition is too low, the composition does not sufficiently cure, while if the content is too high, the resin properties (for example, flexibility) of the cured matter of the composition deteriorate. Thus, based on 100 parts by mass of the thermosetting resin, the content is preferably 1 to 70 parts by mass, and more preferably 1 to 50 parts by mass.

Examples of thermosetting resins which can be used include thermosetting epoxy resins, thermosetting urea resins, thermosetting melamine resins, and thermosetting phenol resins. Among these, if adhesive strength after curing is considered as a beneficial point, it is preferred to use a thermosetting epoxy resin.

Such a thermosetting epoxy resin may be in a liquid or a solid state, and preferably has an epoxy equivalent of usually about 100 to 4000, and two or more epoxy groups in the molecule. Examples which can be preferably used include bisphenol A epoxy compounds, phenol novolac epoxy compounds, cresol novolac epoxy compounds, ester-type epoxy compounds, and alicyclic epoxy compounds. In addition, examples of the thermosetting epoxy resin may include monomers and oligomers of these compounds.

The thermosetting resin composition of the present invention may optionally include a filling agent such as silica and mica, a silane coupling agent, a pigment, an antistatic agent and the like.

The thermosetting resin composition according to the present invention can be produced by uniformly mixing and stirring by an ordinary method the latent curing agent of the present invention, the thermosetting resin, and the other optionally-added additives.

Since the thus-obtained thermosetting resin composition of the present invention uses the latent curing agent of the present invention, even if the latent curing agent is added in a relatively smaller amount than conventionally, curing is still possible without harming the low-temperature rapid curing properties.

The thermosetting resin composition of the present invention can be preferably used as an adhesive film for a solar battery by forming it into a film. Further, the thermosetting resin composition can also be preferably used as an anisotropic conductive adhesive film by dispersing known conductive particles for anisotropic conductive connection in the composition, and then forming the resultant dispersion into a film.

EXAMPLES

The present invention will now be described in more detail based on the following examples.

Example 1

Preparation of Porous Resin Particles

Added to a three-liter interfacial polymerization vessel equipped with a thermometer were 840 parts by mass of distilled water, 0.05 parts by mass of a surfactant (Newrex R-T, NOF Corporation), and 8 parts by mass of gelatin (AP-100 fine powder, Nitta Gelatin Inc.), and the resultant solution was uniformly mixed. To this mixed solution was further added an oil phase in which 150 parts by mass of a methylenediphenyl-4,4'-diisocyanate (3 mol) in trimethylolpropane (1 mol) adduct (D-109, Mitsui Chemicals Inc.) was dissolved in 450 parts by mass of ethyl acetate. The resultant solution was emulsified and mixed using a homogenizer (T-65D, IKA Japan) at 7,200 rpm at room temperature for 5 minutes so that the volume average particle size was 10 µm or less, to obtain an oil-in-water emulsion.

Next, the emulsion was heated to 80° C. while stirring with a vaned stirring rod. Stirring was continued at this temperature for 3 hours to carry out interfacial polymerization, whereby a polymerization reaction solution in which the porous resin particles were dispersed in the aqueous phase was obtained.

After the interfacial polymerization reaction was finished, the temperature of the polymerization reaction solution was adjusted to 40° C. The solution was then added with 0.8 parts by mass of an enzyme (Protease N "Amano G", Amano Enzyme Inc.), and the resultant solution was stirred at 40° C. for 6 hours to carry out an enzyme treatment on the porous resin particles. After the enzyme treatment, the porous resin particles were collected from the polymerization reaction solution by filtration, washed with water, and then dried to obtain the spherical porous resin particles of Example 1.

Figure 1B:
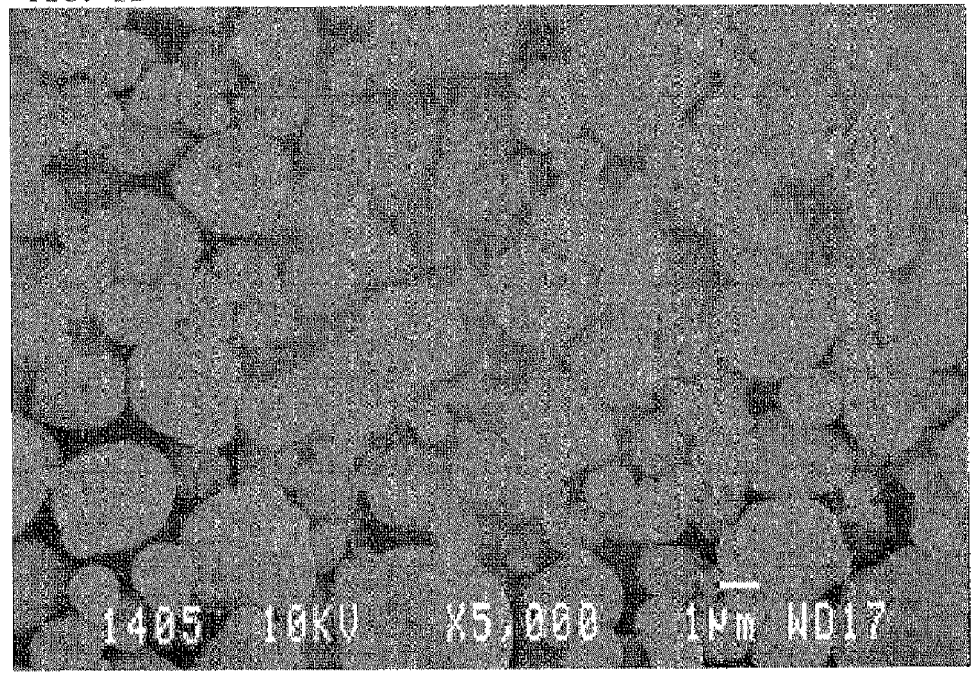
FIG. 1B is an electron micrograph (5,000 times magnification) of the porous resin particles of Example 1.

The particle size distribution of the obtained porous resin particles was measured using a particle size distribution measurement apparatus (SD-2000, Sysmex Corporation). The obtained distribution diagram is illustrated in FIG. 1A. Further, electron micrographs are shown in FIG. 1B (5,000 times magnification) and FIG. 1C (20,000 times magnification). For reference, FIG. 1D (5,000 times magnification) shows an electron micrograph of the porous resin particles of Reference Example 1, which were prepared in the same manner except that the amount of ethyl acetate used when preparing the oil phase was changed from 450 parts by mass to 200 parts by mass.

From FIG. 1A, it can be seen that the average particle size (in terms of volume) is 2.5 µm, and the maximum particle size is 6.6 µm.

Figure 1C:
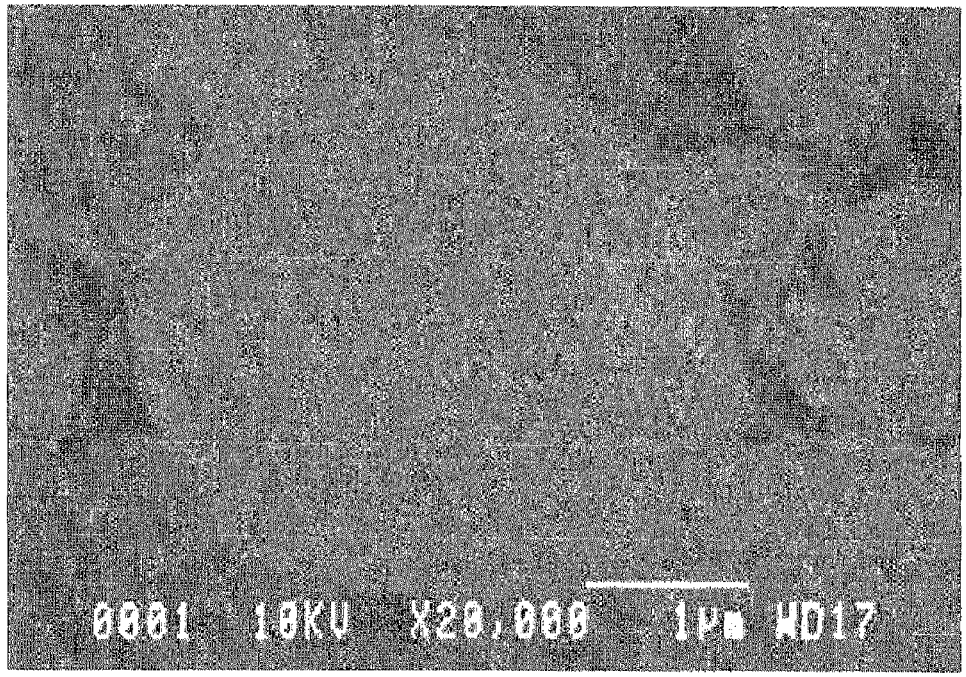
FIG. 1C is an electron micrograph (20,000 times magnification) of the porous resin particles of Example 1.
Figure 1D:
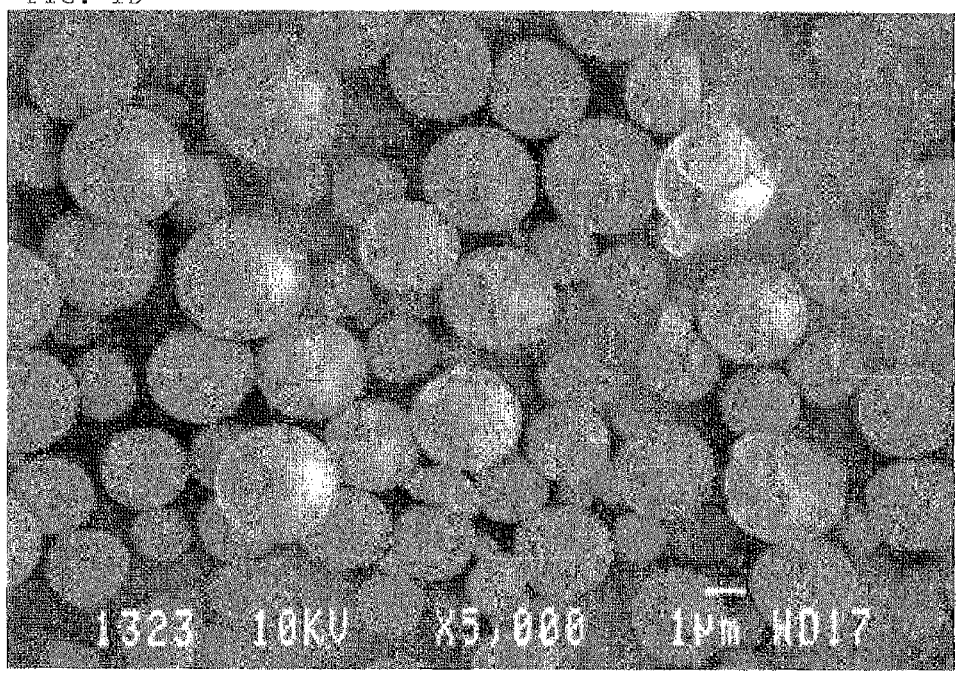
FIG. 1D is an electron micrograph (5,000 times magnification) of the porous resin particles of Reference Example 1.

Further, from FIGS. 1B, 1C, and 1D, it can be seen that if the ethyl acetate content in the oil phase is decreased, the porous resin particles obtained after the interfacial polymerization have a spherical shape, and conversely that if the ethyl acetate content is increased, the shape of the porous resin particles changes from spherical to a deformed round shape. In addition, it can also be seen that surface unevenness is not formed in either case. These results can be considered as being due to the following. When there is a large ethyl acetate content, hydrolysis of the isocyanate groups is suppressed during emulsification, so that the reaction between the amino groups in the gelatin in the aqueous phase and the isocyanate groups in the isocyanate compound proceeds competitively. Conversely, when there is a small ethyl acetate content, the interfacial polymerization properties of the isocyanate compound improve. Moreover, since the particles are spherical, the permeability of the imidazole compound solution can be expected to deteriorate. In addition, since there is no surface unevenness, the adverse effect on the curing properties of the latent curing agent due to the jet mill cracking treatment can be expected to be suppressed.

<Imidazole Compound Permeation Treatment>

Ten parts by mass of the obtained porous resin particles of Example 1 were added to 100 parts by mass of a solution formed by dissolving 40 parts by mass of 2-methylimidazole having a melting point of 137 to 145° C. (2MZ-H, Shikoku Chemicals Corporation) in 60 parts by mass of ethanol, and the resultant mixture was stirred at 30° C. for 6 hours at 200 rpm. Subsequently, the stirring was continued at room temperature for 20 hours. After the stirring was finished, the porous resin particles that had been subjected to the imidazole permeation treatment were collected by filtration, washed with distilled water, then vacuum dried, and subjected to a cracking treatment with a jet mill (AO-JET MILL, Seishin Enterprise Co., Ltd.) to form primary particles, whereby a latent curing agent was obtained.

<Preparation of Thermosetting Resin Composition>

A thermosetting resin composition was obtained by uniformly mixing 20 parts by mass of the obtained latent curing agent in 80 parts by mass of a bisphenol A liquid epoxy resin (EP828, Mitsubishi Chemical Corporation) using a kneader (Awatori Rentaro, Thinky Co., Ltd.).

<DSC Measurement of Thermosetting Resin Composition>

The obtained thermosetting resin composition was subjected to differential scanning calorimetry (evaluation amount 5 mg, rate of temperature increase 10° C./minute) using a differential scanning calorimeter (DSC) (DSC 6200, Seiko Instruments Inc.). The obtained results are shown in Table 1 and FIG. 2. Here, concerning the curing properties of the latent curing agent, "exothermic onset temperature" means the temperature at which curing starts, "exothermic peak temperature" means the temperature at which curing is most active, and "gross heat value" means the amount of heat produced from start to completion of the curing reaction.

Example 2

A latent curing agent was prepared in the same manner as in Example 1, except that 2-ethyl-4-methylimidazole having a melting point of 41° C. (2E4MZ, Shikoku Chemicals Corporation) was used instead of the 2-methylimidazole. Further, a thermosetting resin composition was prepared using this latent curing agent. The obtained thermosetting resin composition was subjected to differential scanning calorimetry in the same manner as in Example 1. The obtained results are shown in Table 1 and FIG. 2.

Example 3

A latent curing agent was prepared in the same manner as in Example 1, except that 2-phenylimidazole having a melting point of 137 to 147° C. (2PZ-PW, Shikoku Chemicals Corporation) was used instead of the 2-methylimidazole. Further, a thermosetting resin composition was prepared using this latent curing agent. The obtained thermosetting resin composition was subjected to differential scanning calorimetry in the same manner as in Example 1. The obtained results are shown in Table 1 and FIG. 2.

TABLE 1

| | IMIDAZOLE (m.p., ° C.) | EXOTHERMIC ONSET TEMPERATURE (° C.) | EXOTHERMIC PEAK TEMPERATURE (° C.) | GROSS HEAT VALUE (J/g) |
|---|---|---|---|---|
| Example 1 | 2MZ-H (137) | 107.7 | 138.4 | 393 |
| Example 2 | 2E4MZ (41) | 103.9 | 130.2 | 380 |
| Example 3 | 2PZ-PW (137) | 114.0 | 137.9 | 371 |

Figure 2:
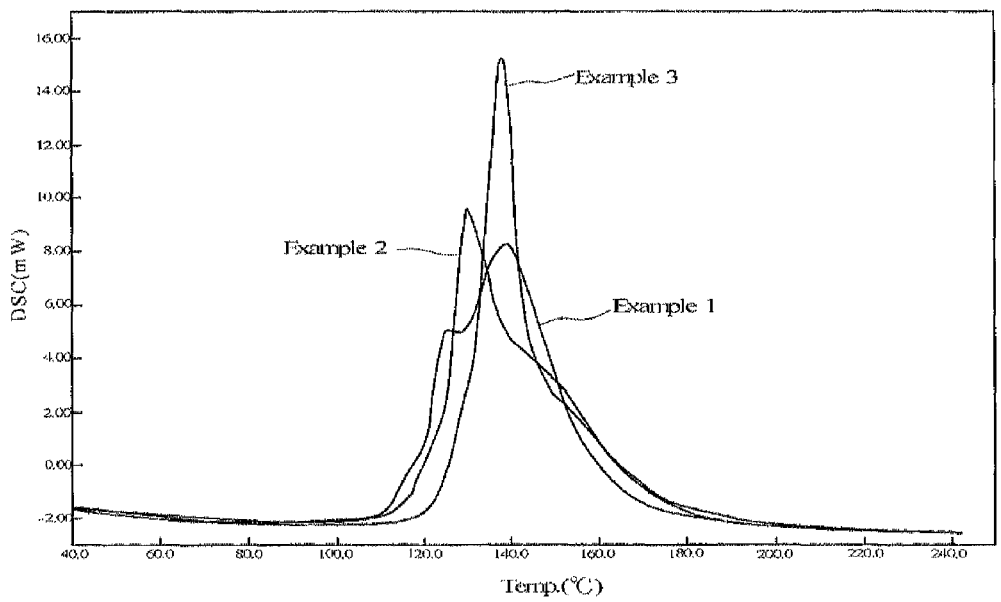
FIG. 2 is a DSC measurement diagram of the thermosetting resin compositions of Examples 1 to 3.

From Table 1 and FIG. 2, it can be seen that the thermosetting resin compositions of Examples 1 and 3, which used a latent curing agent obtained by making an imidazole compound having a melting point of 137° C. permeate into porous resin particles, exhibit an exothermic onset temperature around 110° C. and a weak exothermic peak temperature at 140° C. Therefore, it can be seen that low-temperature rapid curing properties could be realized while exhibiting latency. Further, it can also be seen that the thermosetting resin composition of Example 2, which used a latent curing agent obtained by making an imidazole compound having a melting point of 41° C. permeate into porous resin particles, had an exothermic onset temperature that had shifted to about 100° C., and favorable low-temperature rapid curing properties. Moreover, it can be seen that Example 2 exhibited the same gross heat value as Examples 1 and 3.

Example 4

A latent curing agent was prepared in the same manner as in Example 1, except that of the 40 parts by mass of 2-methylimidazole, 10 parts by mass of that amount was replaced with 2,4,6-tris(dimethylaminomethyl)phenol (Luveak-DMP-30, Nacalai Tesque, Inc.) as a liquid tertiary amine curing accelerator. Further, a thermosetting resin composition was prepared using this latent curing agent. The obtained thermosetting resin composition was subjected to differential scanning calorimetry in the same manner as in Example 1. The obtained results are shown in Table 2 and FIG. 3.

Example 5

A latent curing agent was prepared in the same manner as in Example 1, except that of the 40 parts by mass of 2-methylimidazole, 20 parts by mass of that amount was replaced with 2,4,6-tris(dimethylaminomethyl)phenol (Luveak-DMP-30, Nacalai Tesque, Inc.) as a liquid tertiary amine curing accelerator. Further, a thermosetting resin composition was prepared using this latent curing agent. The obtained thermosetting resin composition was subjected to differential scanning calorimetry in the same manner as in Example 1. The obtained results are shown in Table 2 and FIG. 3. For reference, the results of Example 1 are also shown in Table 2 and FIG. 3.

TABLE 2

| | IMIDAZOLE (parts by mass) | TERTIARY AMINE CURING ACCELERATOR (parts by mass) | EXOTHERMIC ONSET TEMPERATURE (° C.) | EXOTHERMIC PEAK TEMPERATURE (° C.) | GROSS HEAT VALUE (J/g) |
|---|---|---|---|---|---|
| Example 1 | 40 | 0 | 107.7 | 138.4 | 393 |
| Example 4 | 30 | 10 | 80.5 | 118.9 | 392 |
| Example 5 | 20 | 20 | 98.6 | 137.0 | 372 |

Figure 3:
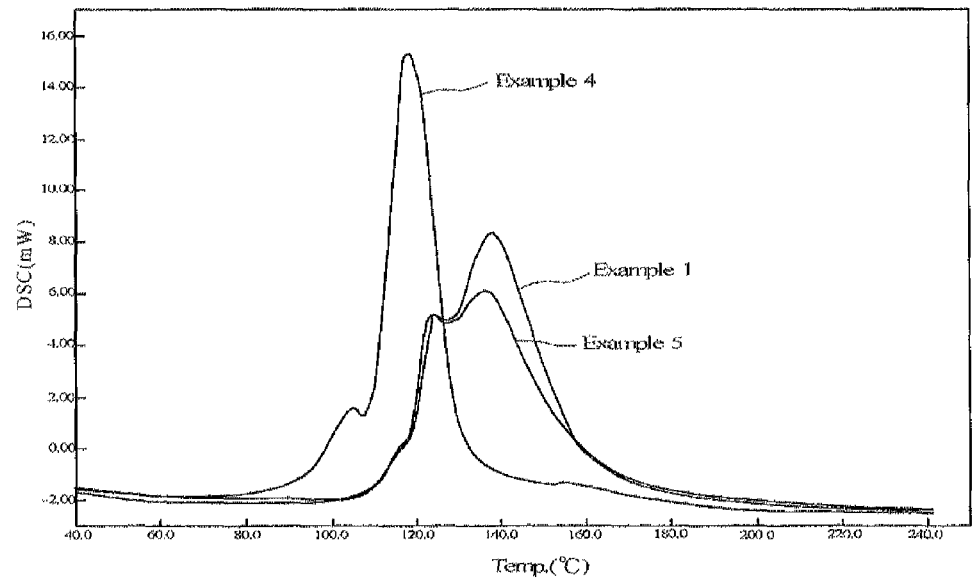
FIG. 3 is a DSC measurement diagram of the thermosetting resin compositions of Examples 1, 4, and 5.

From Table 2 and FIG. 3, it can be seen that by replacing a part of the imidazole compound with a liquid tertiary amine curing accelerator, the fluidity of the imidazole compound was improved when heated. This enabled the exothermic onset temperature and the exothermic peak temperature to both shift to the lower temperature side, and the low-temperature rapid curing properties to improve. However, it can also be seen that if the ratio of the tertiary amine curing accelerator is increased too much, the exothermic onset temperature and the exothermic peak temperature do not shift as much to the lower temperature side.

Example 6

A latent curing agent was prepared in the same manner as in Example 1, except that of the 40 parts by mass of 2-methylimidazole, 10 parts by mass of 2-ethyl-4-methylimidazole having a melting point of 41° C. (2E4MZ, Shikoku Chemicals Corporation) was used. Further, a thermosetting resin composition was prepared using this latent curing agent. The obtained thermosetting resin composition was subjected to differential scanning calorimetry in the same manner as in Example 1. The obtained results are shown in Table 3 and FIG. 4.

Example 7

A latent curing agent was prepared in the same manner as in Example 1, except that of the 40 parts by mass of 2-methylimidazole, 10 parts by mass of 2-phenylimidazole having a melting point of 137 to 147° C. (2PZ-PW, Shikoku Chemicals Corporation) was used. Further, a thermosetting resin composition was prepared using this latent curing agent. The obtained thermosetting resin composition was subjected to differential scanning calorimetry in the same manner as in Example 1. The obtained results are shown in Table 3 and FIG. 4.

Example 8

A latent curing agent was prepared in the same manner as in Example 1, except that of the 40 parts by mass of 2-methylimidazole, 10 parts by mass of 2-phenyl-4-methylimidazole having a melting point of 174 to 184° C. (2P4MZ, Shikoku Chemicals Corporation) was used. Further, a thermosetting resin composition was prepared using this latent curing agent. The obtained thermosetting resin composition was subjected to differential scanning calorimetry in the same manner as in Example 1. The obtained results are shown in Table 3 and FIG. 4. For reference, the results of Example 1 are also shown in Table 3 and FIG. 4.

TABLE 3

| | ADDITIONAL IMIDAZOLE | EXOTHERMIC ONSET TEMPERATURE (° C.) | EXOTHERMIC PEAK TEMPERATURE (° C.) | GROSS HEAT VALUE (J/g) |
|---|---|---|---|---|
| Example 1 | — | 107.7 | 138.4 | 393 |
| Example 6 | 2E4MZ | 82.8 | 116.4 | 394 |
| Example 7 | 2PZ-PW | 87.2 | 118.1 | 403 |
| Example 8 | 2P4MZ | 108.2 | 138.7 | 371 |

Figure 4:
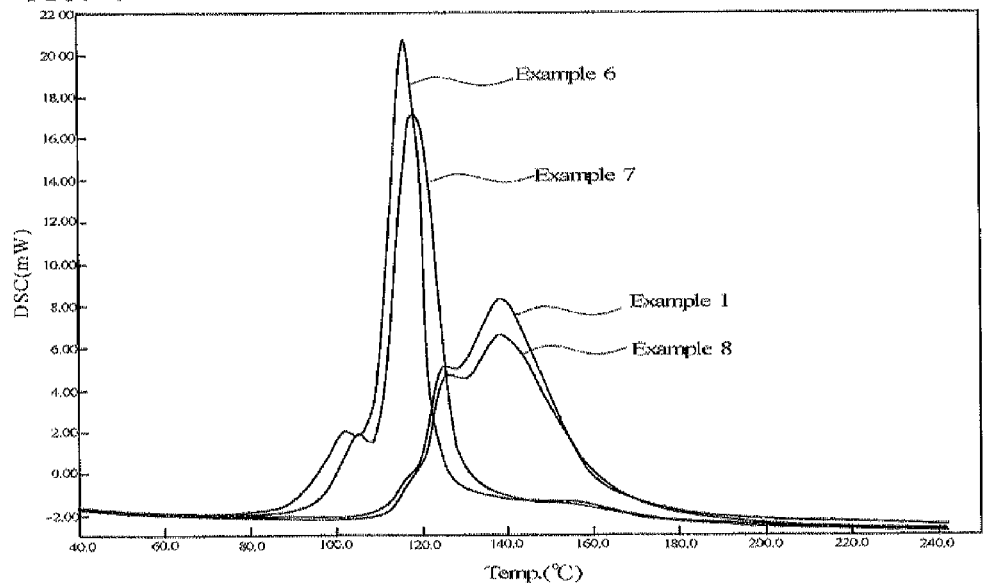
FIG. 4 is a DSC measurement diagram of the thermosetting resin compositions of Examples 1 and 6 to 8.

From Table 3 and FIG. 4, it can be seen that combining 2-methylimidazole with an imidazole compound having an equal to, or lower melting point than, 2-methylimidazole enables the exothermic onset temperature and the exothermic peak temperature to both be shifted to the lower temperature side, and the low-temperature rapid curing properties to be improved. However, no combined effect was seen in Example 8, which combined 2-methylimidazole with an imidazole compound having a melting point that was about 40° C. higher than 2-methylimidazole.

Comparative Example 1

Figure 5:
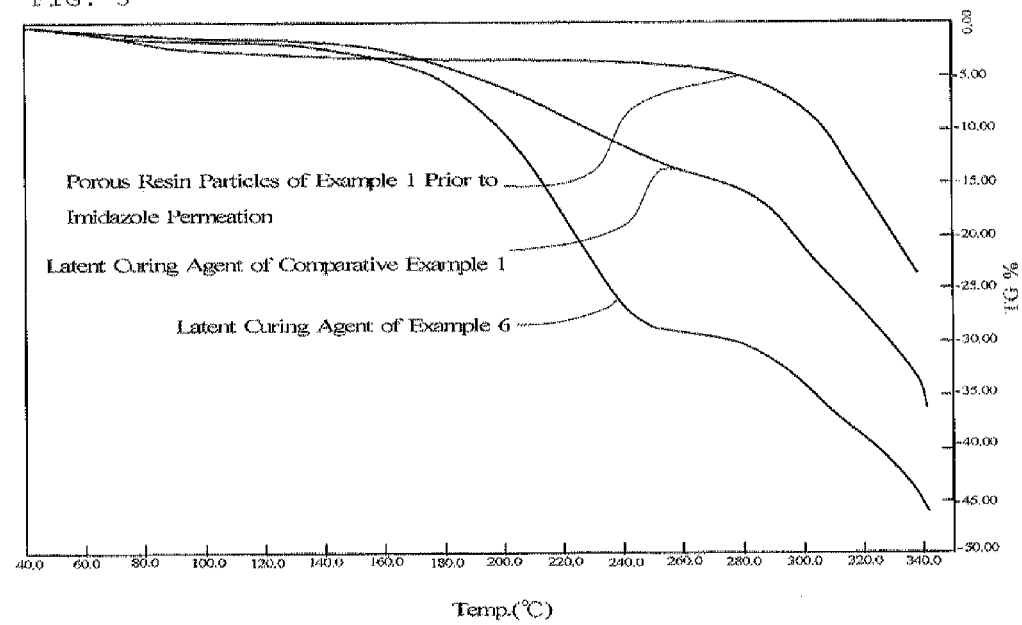
FIG. 5 is a TG-DTA measurement diagram of the latent curing agent of Comparative Example 1, the porous resin particles of Example 1, and the latent curing agent of Example 6.

A latent curing agent was prepared in the same manner as in Example 1, except that 4 parts by mass of a polyvinyl alcohol (PVA 205, Kuraray Co., Ltd.) was used instead of the 8 parts by mass of gelatin (AP-100 fine powder, Nitta Gelatin Inc.). The heating weight loss (evaluation amount 5 mg, rate of temperature increase 10° C./minute) of the obtained latent curing agent was measured using a thermogravimetric-differential thermal analyzer (TG-DTA) (TG/DTA 6200, Seiko Instruments Inc.). The obtained results are shown in Table 4 and FIG. 5. For reference, the heating weight loss of the porous resin particles prepared in Example 1 prior to the imidazole compound permeation treatment and the latent curing agent prepared in Example 6 was also measured. These results are shown in Table 4 and FIG. 5. The heating weight loss is the ratio of the decrease in weight during heating at 260° C. (pyrolysis onset temperature) with respect to the initial weight. The encapsulation ratio is a value obtained by subtracting the weight loss of the porous resin particles of Example 1 prior to the imidazole compound permeation treatment from the weight loss.

TABLE 4

| | WEIGHT LOSS (%) | ENCAPSULATION RATIO (%) |
|---|---|---|
| POROUS RESIN PARTICLES OF EXAMPLE 1 PRIOR TO IMIDAZOLE PERMEATION | 4.19 | 0 |
| LATENT CURING AGENT OF EXAMPLE 6 | 29.21 | 25.02 |

TABLE 4-continued

| | WEIGHT LOSS (%) | ENCAPSULATION RATIO (%) |
|---|---|---|
| LATENT CURING AGENT OF COMPARATIVE EXAMPLE 1 | 13.94 | 9.75 |

It can be seen that the latent curing agent of Example 6, which used gelatin instead of a polyvinyl alcohol, had a far greater imidazole compound permeation amount into the porous resin particles than the conventional latent curing agent of Comparative Example 1, which used a polyvinyl alcohol as a dispersant during interfacial polymerization.

Example 9

Effect of Heat Treatment on Latent Curing Agent

Test Example A: A latent curing agent was prepared by repeating Example 4, and a thermosetting resin composition was then prepared using this latent curing agent. The obtained thermosetting resin composition was subjected to differential scanning calorimetry in the same manner as in Example 1. The obtained results are shown in Table 5 and FIG. 6 (corresponding to Example 4).

Test Example B: The latent curing agent prepared in Example 4 was heat treated at 120° C. for 30 minutes. Then, a thermosetting resin composition was prepared in the same manner as in Example 4 using this heat-treated latent curing agent. The obtained thermosetting resin composition was subjected to differential scanning calorimetry in the same manner as in Example 1. The obtained results are shown in Table 5 and FIG. 6.

Test Example C: A latent curing agent was prepared by repeating Example 4, and a thermosetting resin composition was then prepared using this latent curing agent. Next, the obtained thermosetting resin composition was thermally aged at 55° C. for 7 hours. Subsequently, the thermally-aged thermosetting resin composition (the thermosetting resin composition of Test Example A, which had been thermally aged at 55° C. for 7 hours) was subjected to differential scanning calorimetry in the same manner as in Example 1. The obtained results are shown in Table 5 and FIG. 6.

Test Example D: The latent curing agent prepared in Example 4 was heat treated at 120° C. for 30 minutes. Then, a thermosetting resin composition was prepared in the same manner as in Example 4 using this heat-treated latent curing agent. Next, the obtained thermosetting resin composition was thermally aged at 55° C. for 7 hours. Subsequently, the thermally-aged thermosetting resin composition (the thermosetting resin composition of Test Example B, which had been thermally aged for 7 hours at 55° C.) was subjected to differential scanning calorimetry in the same manner as in Example 1. The obtained results are shown in Table 5 and FIG. 6.

TABLE 5

| THERMOSETTING RESIN COMPOSITION | EXOTHERMIC ONSET TEMPERATURE (° C.) | EXOTHERMIC PEAK TEMPERATURE (° C.) | GROSS HEAT VALUE (J/g) |
|---|---|---|---|
| TEST EXAMPLE A SAME THERMOSETTING RESIN COMPOSITION AS IN EXAMPLE 4 | 80.5 | 118.9 | 392 |
| TEST EXAMPLE B SAME THERMOSETTING RESIN COMPOSITION AS IN EXAMPLE 4, EXCEPT THAT LATENT CURING AGENT WAS THERMALLY AGED AT 120° C. FOR 30 MINUTES | 93.6 | 123.6 | 396 |
| TEST EXAMPLE C THERMOSETTING RESIN COMPOSITION OF TEST EXAMPLE A THAT HAD BEEN AGED AT 55° C. FOR 7 HOURS | 109.2 | 154.8 | 259 |
| TEST EXAMPLE D THERMOSETTING RESIN COMPOSITION OF TEST EXAMPLE B THAT HAD BEEN AGED AT 55° C. FOR 7 HOURS | 92.5 | 125.6 | 384 |

Figure 6:
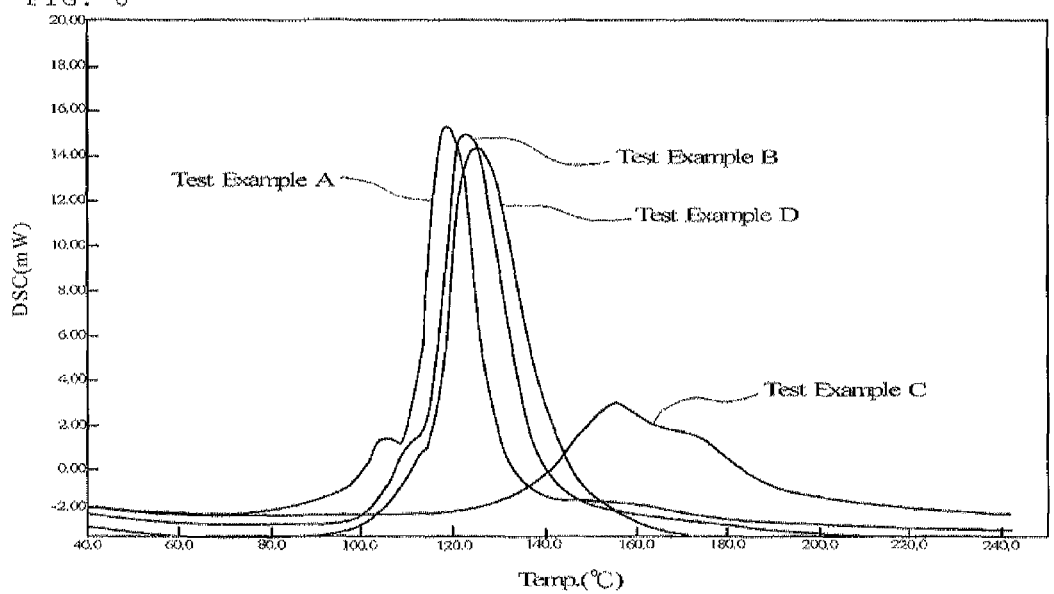
FIG. 6 is a DSC measurement diagram of the test results of Example 9.

From the results of Table 5 and FIG. 6, it can be seen that thermal stability is improved and latency is increased by heat treating the latent curing agent before adding to the thermosetting resin composition so as to remove the imidazole compound that is at or near the surface by sublimation.

INDUSTRIAL APPLICABILITY

The production method of the present invention is useful in the production of a latent curing agent for a thermosetting resin composition that is used in cases of having to join an electronic part, such as an IC chip, to a wiring substrate without applying an overly-large heat shock.

The invention claimed is:

1. A method for producing a latent curing agent in which an imidazole compound is held in porous resin particles obtained by interfacial polymerization of a polyfunctional isocyanate compound, the method comprising the following steps (A) to (E):

Step (A) a step of obtaining an oil-in-water emulsion by emulsifying an oil phase obtained by dissolving a polyfunctional isocyanate compound in an organic solvent in an aqueous phase obtained by dissolving a water-soluble polypeptide and a surfactant in water;

Step (B) a step of forming porous resin particles by interfacial polymerization of the polyfunctional isocyanate compound in the oil phase by heating the oil-in-water emulsion;

Step (C) a step of carrying out an enzyme degradation treatment on the porous resin particles by adding a proteolytic enzyme into an interfacial polymerization solution in which the porous resin particles are dispersed;

Step (D) a step of recovering the porous resin particles that have been subjected to the enzyme degradation treatment from the interfacial polymerization reaction solution; and Step (E) a step of acquiring a latent curing agent in which an imidazole compound is held in porous resin particles, by mixing the recovered porous resin particles with an imidazole compound solution obtained by dissolving an imidazole compound in an organic solvent, wherein the imidazole compound solution further includes a tertiary amine compound and the tertiary amine compound is present in an amount that is 0.1 to 0.8 times by mass an amount of the imidazole compound, to make the imidazole compound solution permeate into the porous resin particles.

2. The production method according to claim 1, wherein in the step (A), the oil phase is obtained by dissolving the polyfunctional isocyanate compound in the organic solvent, the organic solvent being used in an amount that is 1.5 to 5 times by mass an amount of the polyfunctional isocyanate compound.

3. The production method according to claim 1, wherein the water-soluble polypeptide is gelatin.

4. The production method according to claim 3, wherein the gelatin used exhibits a jelly strength according to JIS K6503-2001 of 10 to 250.

5. The production method according to claim 1, wherein the tertiary amine compound includes 2,4,6-tris(dimethylaminomethyl)phenol.

6. The production method according to claim 1, wherein the tertiary amine is liquid.

7. The production method according to claim 6, wherein the tertiary amine is selected from the group consisting of dimethylethanolamine, dimethylbenzylamine, 2,4,6-tris(dimethylaminomethyl)phenol, and 1,8-diazabicyclo[5.4.0]undecene.

8. A thermosetting resin composition comprising the latent curing agent obtained by the production method according to claim 1, and a thermosetting resin.

9. The thermosetting resin composition according to claim 8, wherein the thermosetting resin is a thermosetting epoxy resin.

10. An anisotropic conductive adhesive film formed by dispersing conductive particles for anisotropic conductive connection in the thermosetting resin composition according to claim 8, and then forming the resultant dispersion into a film.

11. An adhesive film for a solar battery obtained by forming the thermosetting resin composition according to claim 8 into a film.

12. A method for producing a latent curing agent in which an imidazole compound is held in porous resin particles obtained by interfacial polymerization of a polyfunctional isocyanate compound, the method comprising the following steps (A) to (E):

Step (A) a step of obtaining an oil-in-water emulsion by emulsifying an oil phase obtained by dissolving a polyfunctional isocyanate compound in an organic solvent in an aqueous phase obtained by dissolving a water-soluble polypeptide and a surfactant in water;

Step (B) a step of forming porous resin particles by interfacial polymerization of the polyfunctional isocyanate compound in the oil phase by heating the oil-in-water emulsion;

Step (C) a step of carrying out an enzyme degradation treatment on the porous resin particles by adding a proteolytic enzyme into an interfacial polymerization solution in which the porous resin particles are dispersed;

Step (D) a step of recovering the porous resin particles that have been subjected to the enzyme degradation treatment from the interfacial polymerization reaction solution; and Step (E) a step of acquiring a latent curing agent in which an imidazole compound is held in porous resin particles, by mixing the recovered porous resin particles with an imidazole compound solution obtained by dissolving an imidazole compound in an organic solvent to make the imidazole compound solution permeate into the porous resin particles, wherein the imidazole compound includes two kinds of imidazole compound comprising 2-methylimidazole and a second imidazole compound having a melting point equal to or lower than the melting point of 2-methylimidazole.

13. The production method according to claim 12, wherein the second imidazole compound comprises 2-ethyl-4-methylimidazole or 2-phenylimidazole.

* * * * *